United States Patent
Pan

(10) Patent No.: US 7,376,409 B2
(45) Date of Patent: May 20, 2008

(54) BANDPASS FILTER WITH INTEGRATED VARIABLE GAIN FUNCTION USING IMPROVED RESISTOR ARRAY

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 688 days.

(21) Appl. No.: 10/879,588

(22) Filed: Jun. 30, 2004

(65) Prior Publication Data
US 2005/0221789 A1   Oct. 6, 2005

Related U.S. Application Data

(63) Continuation-in-part of application No. 10/840,271, filed on May 7, 2004, which is a continuation-in-part of application No. 10/813,270, filed on Mar. 31, 2004.

(51) Int. Cl.
*H04B 1/10* (2006.01)

(52) U.S. Cl. .................. 455/307; 455/296; 455/334; 455/67.11

(58) Field of Classification Search ........... 455/307, 455/334, 296, 309, 232.1, 234.1, 67.11, 63.1; 333/173, 172
See application file for complete search history.

(56) References Cited

U.S. PATENT DOCUMENTS

| | | | |
|---|---|---|---|
| 4,724,407 A * | 2/1988 | Miura et al. ............... 333/172 |
| 4,857,778 A * | 8/1989 | Hague ....................... 333/173 |
| 4,866,779 A * | 9/1989 | Kennedy et al. ......... 455/232.1 |
| 5,028,893 A * | 7/1991 | Marrah et al. ............. 333/173 |
| 5,285,502 A * | 2/1994 | Walton et al. ............ 455/67.11 |
| 5,629,655 A * | 5/1997 | Dent .......................... 333/172 |
| 6,370,370 B1 * | 4/2002 | Roth et al. ................. 455/307 |
| 6,437,639 B1 * | 8/2002 | Nguyen et al. ............. 333/172 |
| 6,441,682 B1 * | 8/2002 | Vinn et al. ............... 455/232.1 |
| 7,138,873 B2 * | 11/2006 | Chandra et al. .......... 455/67.11 |
| 2002/0115420 A1 * | 8/2002 | Cheng ........................ 455/333 |
| 2004/0247132 A1 * | 12/2004 | Klayman et al. ........... 455/307 |
| 2005/0118975 A1 * | 6/2005 | Ismail ........................ 455/296 |

\* cited by examiner

*Primary Examiner*—Lana Le
(74) *Attorney, Agent, or Firm*—Squire, Sanders & Dempsey L.L.P.

(57) ABSTRACT

The invention enables a gain adjustment in a receiver to improve signal quality by varying resistance of an input resistor array of a bandpass filter, the array having a plurality of resistors in series with switches that out of the path of the current when the resistors are in use.

17 Claims, 6 Drawing Sheets

$\omega_o = 1/R_f C$
$\omega_c = 1/R_x C$ $Q = \omega_c / 2 \omega_o$

Gain = $R_f/R_i$ $R_x = R_f/2Q$

BANDPASS FILTER WITH INTEGRATED VARIABLE GAIN FUNCTION USING IMPROVED RESISTOR ARRAY

CROSS REFERENCE TO RELATED APPLICATION

This application is a continuation-in-part of, and incorporates by reference, U.S. patent application Ser. No. 10/840,271, filed May 7, 2004, entitled "Bandpass Filter With Integrated Variable Gain Function" by inventor Meng-An Pan, which is a continuation-in-part of, and incorporates by reference, U.S. patent application Ser. No. 10/813,270, filed Mar. 31, 2004, entitled "Programmable IF Frequency Filter For Enabling A Compromise Between DC Offset Rejection And Image Rejection" by inventor Meng-An Pan.

BACKGROUND

1. Technical Field

This invention relates generally to wireless communication systems, and more particularly, but not exclusively, to a bandpass filter with integrated variable gain function.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

Bandpass filters (BPFs) in receivers can incorporate gain setting functions. However, the conventional technique of gain settings may not be accurate due to resistance of switches in an input resistor array.

Accordingly, a new method of gain control is implemented such that the BPF can have gain that is less dependent on the switch on resistance.

SUMMARY

Embodiments of the invention incorporate variable gain settings in a bandpass filter such that gain is less dependent on the switch on resistance.

In an embodiment of the invention, a system comprises a bandpass filter and a baseband circuit coupled together. The bandpass filter filters a received signal and amplifies an amplitude of the received signal by varying resistance of an input resistor array of the filter, the array having a plurality of resistors in series with switches that are out of the path of the current when the resistors are in use. The baseband circuit measures sufficiency of the signal to noise ratio of a signal output from the bandpass filter and provides feedback to the bandpass filter to adjust gain accordingly so that overall noise performance is improved.

In an embodiment of the invention, a method comprises: filtering a signal with a bandpass filter; measuring signal quality (e.g., signal to noise ratio) of the filtered signal; and adjusting the bandpass filter to increase the gain if required to improve signal quality by varying resistance of an input resistor array of the filter, the array having a plurality of resistors in series with switches that are out of the path of the current when the resistors are in use.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
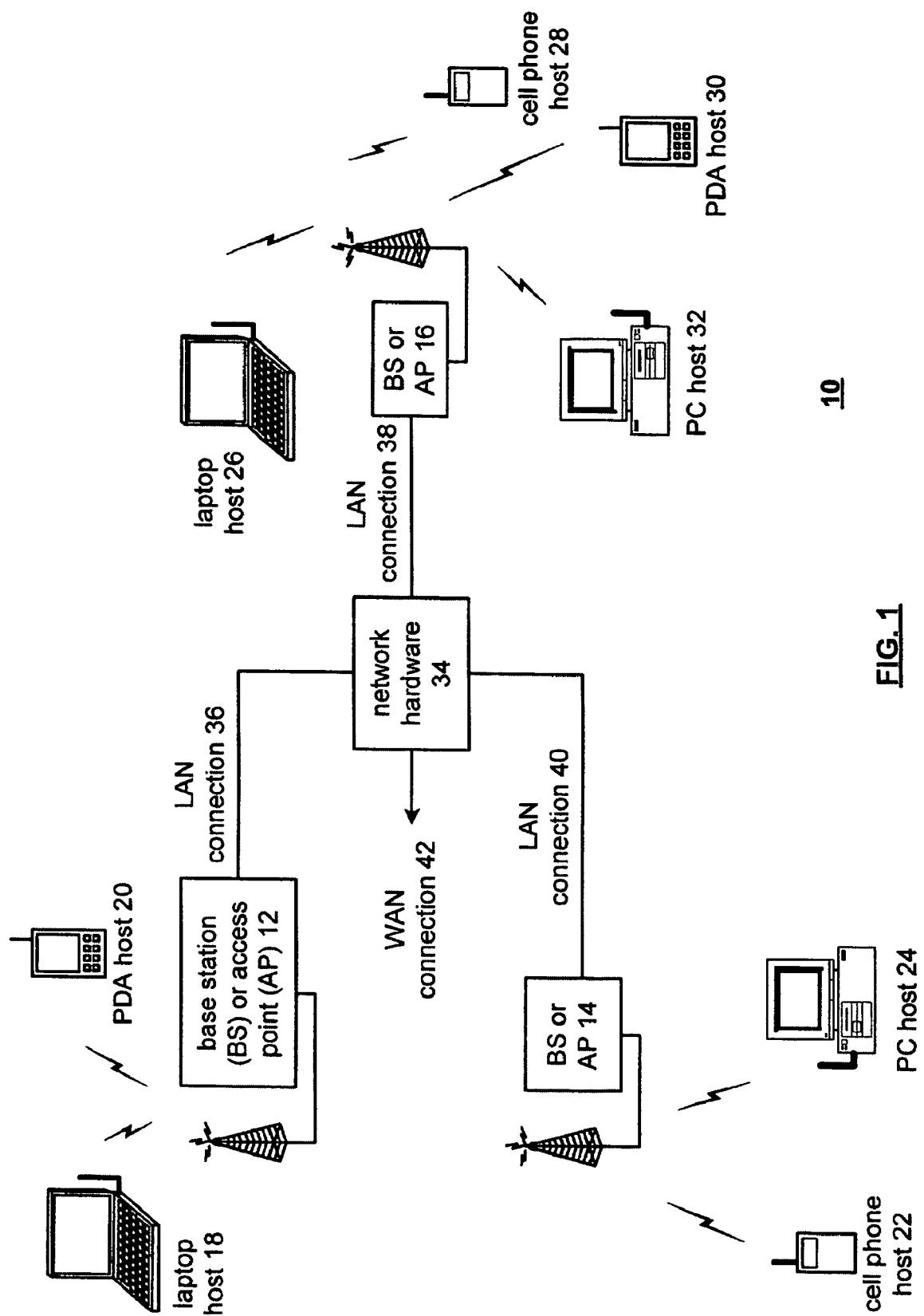
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power and therefore has characteristics of reduced power requirements, thereby extending the life of an associated power supply.

Figure 2:
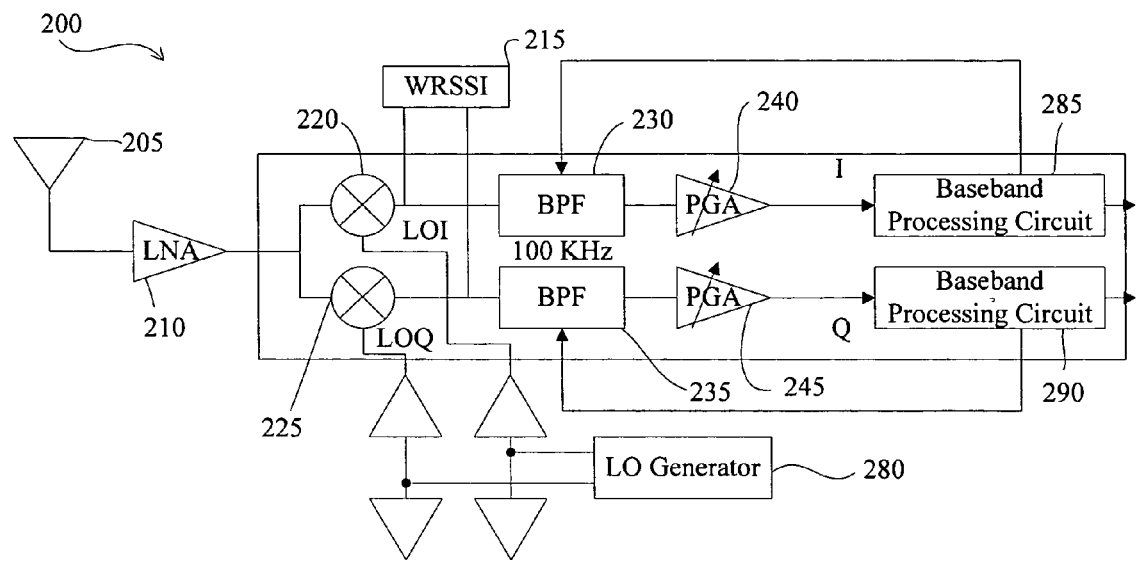
FIG. 2 is a circuit diagram illustrating a receiver.

FIG. 2 is a circuit diagram illustrating a receiver 200 with low-intermediate frequency, which is 100 KHz in this embodiment. An antenna 205 is coupled to a low noise amplifier (LNA) 210, which is coupled to down converters (mixers) 220 and 225. The down converters 220 and 225 are coupled to bandpass filters (BPFs) 230 and 235, respectively, which are coupled to programmable gain amplifiers 240 and 245, respectively. The gain amplifiers 240 and 245 output analog signals to baseband digital processing circuits 285 and 290, respectively. Further, an LO generator 280 is coupled to the down converters 220 and 225. A wideband radio signal strength indicator (WRSSI) 215 is coupled to connections between the down converters 220 and 225 and the bandpass filters 230 and 235.

The antenna 205 receives signals and passes the signals to the LNA 210, which amplifies the received signals and passes them to the down converters 220 and 225, which shifts the frequency of the received signals downwards. The BPFs 230 and 235 discriminate against unwanted frequencies outside of a selected band. The BPFs 230 and 235 also perform channel selection to compromise between image rejection and DC offset rejection and further perform gain functions, as will be discussed in further detail below.

In an embodiment of the invention, each BPF 230 and 235 can comprise 3 biquads with configurations as shown in Table I below.

TABLE I (Center Frequency of 100 KHz)

|  | Biquad1 | Biquad2 | Biquad3 |
|---|---|---|---|
| Center Frequency | 100 KHz | 186 KHz | 13.4 KHz |
| BW | 200 KHz | 100 KHz | 100 KHz |
| Q | 0.5 | 1.866 | 0.134 |
| Gain Setting | 20 dB, 0 dB | 10 dB, 0 dB | 0 dB |
| 30 dB | 20 dB | 10 dB | 0 dB |
| 20 dB | 20 dB | 0 dB | 0 dB |
| 10 dB | 0 dB | 10 dB | 0 dB |
| 0 dB | 0 dB | 0 dB | 0 dB |
| Current | 1.7 mA (I and Q) | 1.7 mA (I and Q) | 1.7 mA (I and Q) |

Each BPF 230 and 235 can have gain settings of 30 dB, 20 dB, 10 dB and 0 dB. IF can be centered at 112 KHz, 108 KHz, 104 KHz, and 100 KHz. Further, the BPFs 230 and 235 can change the IQ polarity.

Control words will vary the coupling resistor 410 values, which is Rx in FIG. 4, and change the IF frequency of the channel select filter 400. Control words for changing the channel selection (frequency selection) of the BPFs 230 and 235 are shown in Table II below.

TABLE II

| BPF Center Frequency | Center Frequency Control Word (4 bit) |
|---|---|
| 112 KHz | 1000 |
| 108 KHz | 0100 |
| 104 KHz | 0010 |
| 100 KHz | 0001 |

Figure 3A:
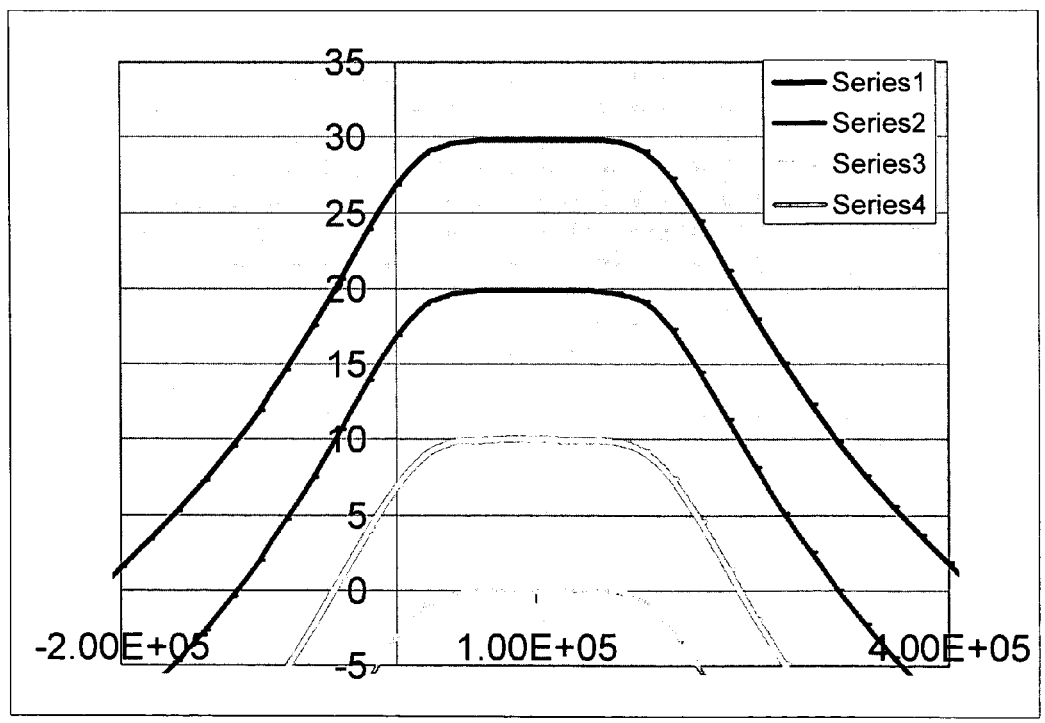
FIG. 3A and FIG. 3B are charts illustrating variable gain in the bandpass filter of the receiver of FIG. 2 and corresponding noise figures.

Control words also vary $R_f$ and $R_i$ (FIG. 4A) values to change the gain of the bandpass filter 230 and 235. As shown in FIG. 3A, in an embodiment of the invention, the BPFs 230 and 235 can have variable gain from 0 db to 30 db in 10 db steps. Control words for the varying gain are shown in Table III below. It will be appreciated by one of ordinary skill in the art that the gain settings are not limited to the values shown in Table III.

TABLE III

| Gain | Gain Control Word (2 bit) | Noise Figure @ 100 KHz |
|---|---|---|
| 30 db | 11 | 18.9 |
| 20 db | 10 | 21 |
| 10 db | 01 | 39 |
| 0 db | 00 | 41 |

Figure 4A:
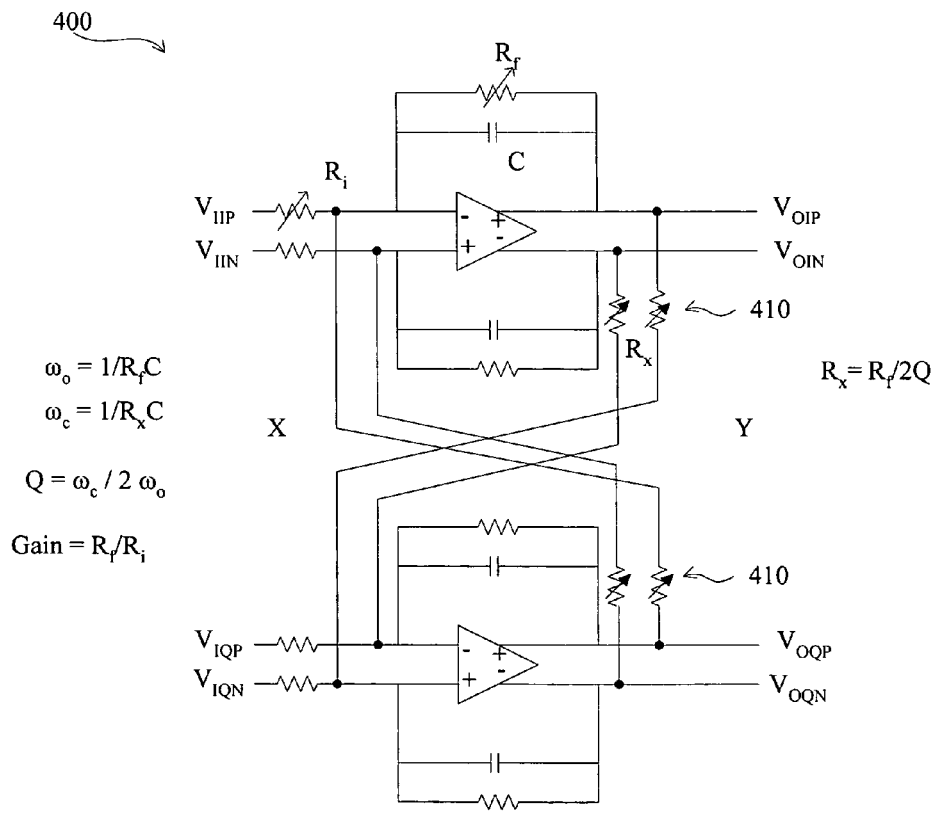
FIGS. 4A and 4B are diagrams illustrating a channel select filter (bandpass filter) of the receiver IF section of FIG. 2 and its electrical equivalent, respectively.

The LO generator 280 determines how to bring an incoming RF signal received at the antenna 205 down to 100 KHz. The PGAs 240 and 245 increase the gain of the BPFs 230 and 235 output. The baseband digital processing circuits 285 and 290 convert analog signals from the PGAs 240 and 245 to digital data and determine if the current gain is adequate (e.g., if signal to noise ratio too low). The baseband digital processing circuits 285 and 290 then adjust the BPF 230 and 235 gain function accordingly by varying $R_f$ and $R_i$ (FIG. 4A). In an embodiment of the invention, the receiver 200 can include measurement circuits (not shown) in place of or in addition to the baseband digital processing circuits 285 and 290 that measure the DC offset rejection and image rejection of the filtered signals and provide feedback to the BPFs 230 and 235 so that a new IF frequency can be chosen to form a better compromise between DC offset rejection and image rejection.

FIG. 3A is a chart illustrating variable gain in the bandpass filter of the receiver of FIG. 2. Gain can be varied by the variation of resistance in the BPFs 230 and 235 as derived below based on the circuits shown in FIG. 4A and FIG. 4B below. Resistance variation (for resistors 410 in FIG. 4A) also enables IF frequency shifting to compensate for DC offset rejection and image rejection.

For a low pass filter:

$$\frac{y}{x} = \frac{\text{Gain}}{1 + j\frac{\omega}{\omega_0}},$$

wherein $\omega_o$ is the corner frequency. For a bandpass filter:

$$\frac{y}{x} = \frac{\text{Gain}}{1 + j\frac{(\omega - \omega_c)}{\omega_0}},$$

wherein $\omega_c$ is the center frequency.

Therefore, for the channel select filter electrical equivalent 420 (FIG. 4B):

$$\frac{y}{x} = \frac{\text{Gain}}{j\frac{W}{W_0} + 1 - j2Q}$$

$$= \frac{\text{Gain}}{1 + j\left(\frac{\omega}{\omega_o} - 2Q\right)}$$

$$= \frac{\text{Gain}}{1 + j\frac{\omega - 2Q\omega_o}{\omega_o}}$$

$$= \frac{\text{Gain}}{1 + j\frac{\omega - \omega_c}{\omega_o}}$$

Therefore, $$\omega_o = \frac{1}{R_f C}$$

$$\omega_c = \frac{1}{R_x C}$$

$$Q = \frac{\omega_c}{2\omega_o}$$

$$\text{Gain} = \frac{R_f}{R_i}$$

Figure 3B:
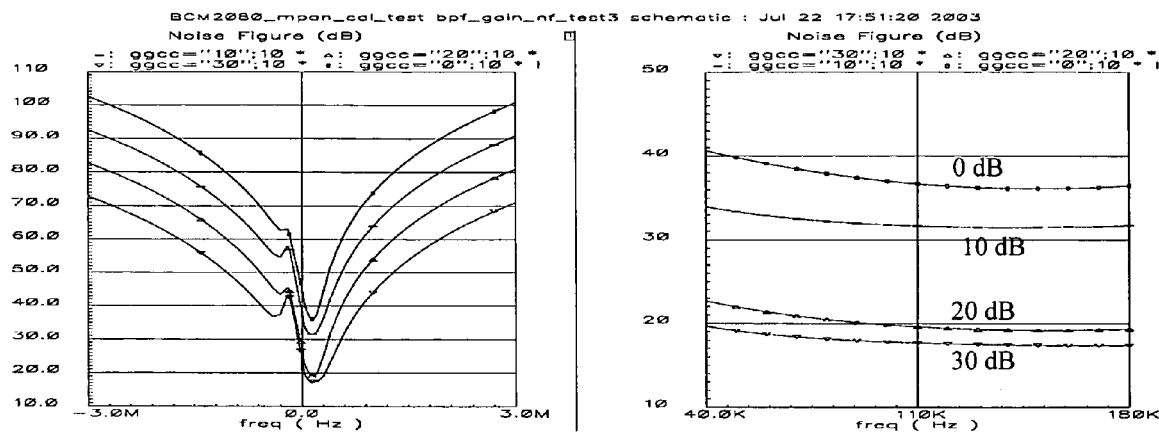

FIG. 3B are charts showing noise figures for the BPFs 230 and 235. As gain is increased, noise decreases, thereby improving the signal to noise ratio.

Figure 4B:
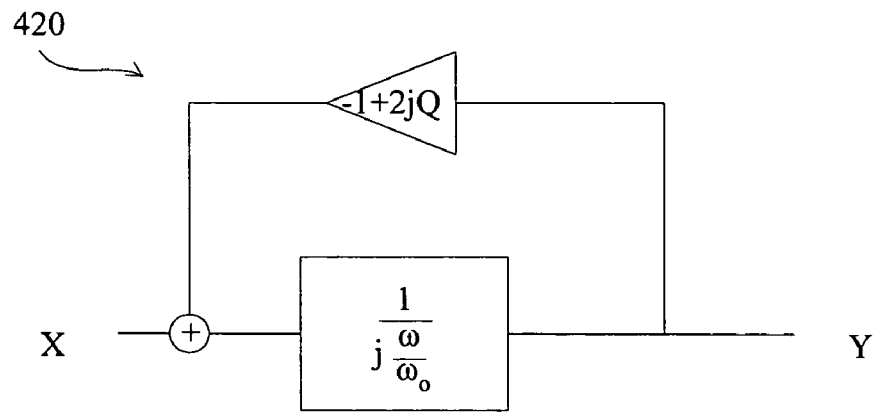

FIG. 4A and FIG. 4B are diagrams illustrating a BPF 400 (e.g., the bandpass filters 230 and 235) and its electrical equivalent, respectively. The filter 400 is an active RC filter that enables achievement of a high dynamic range. The filter 400 comprises two cross coupled low pass filters having cross coupled variable resistors 410, each having a resistance $R_x$. As derived above, variation of $R_x$ shifts the bandpass filter IF frequency up or down. Specifically, the IF frequency of the filter 400 is inversely proportional to $R_x$. In addition, variation of a feedback resistor, $R_f$, and of an input resistor, $R_i$, enable changes in gain of the filter 400 as gain is equal to $R_f/R_i$.

$R_f$ and $R_i$ are set to default values (e.g., zero gain) initially and gain, if any, is applied. After filtering and amplification (by the PGAs 240, 245), the baseband digital processing circuits 285 and 290 determine if the gain is adequate based on the signal to noise ratio. If the gain is insufficient, then the baseband digital processing circuits 285 and 290 provide feedback to the BPFs 230 and 235 and $R_f$ and $R_i$ are adjusted to increase gain in the BPFs 230 and 235. In an embodiment of the invention, $R_i$ can include the resistor arrays structures shown in FIG. 6 and/or FIG. 7.

Figure 5:
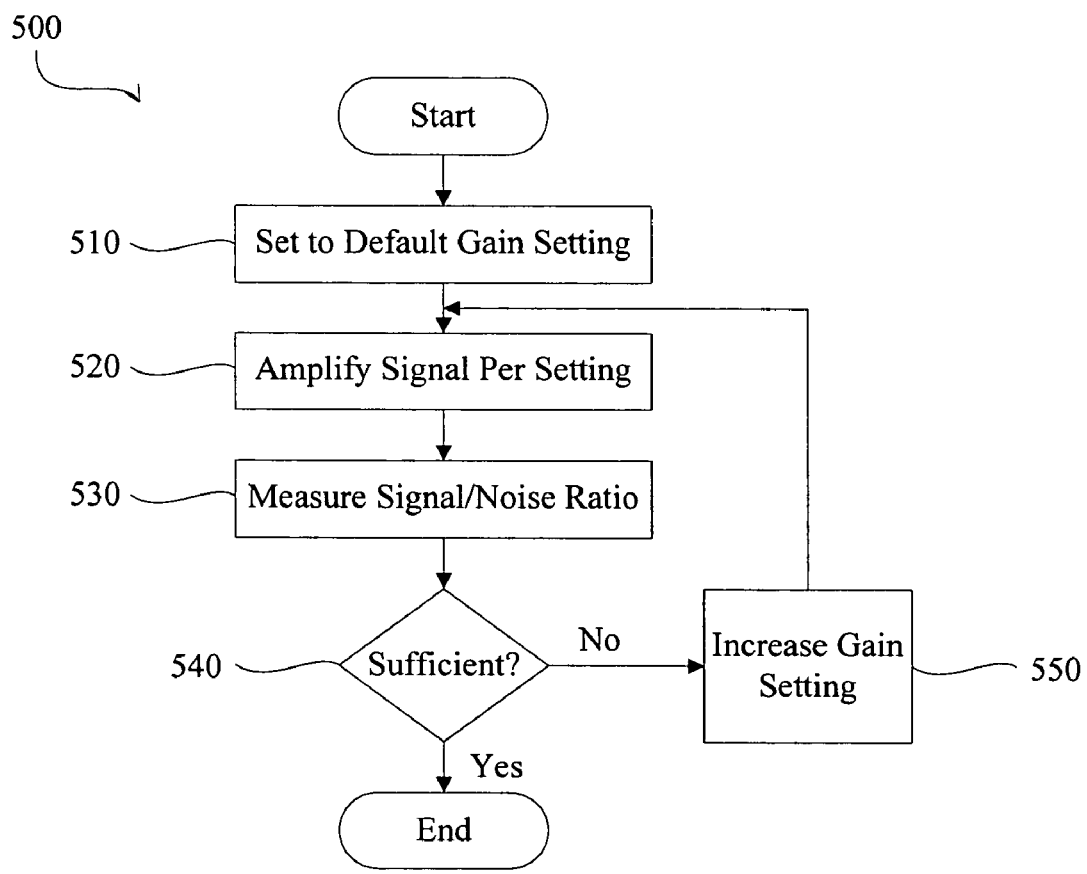
FIG. 5 is a flowchart illustrating a method for variable gain selection in the filter.

FIG. 5 is a flowchart illustrating a method 500 for variable gain selection in the filter 400. In an embodiment of the invention, the filter 400, 600 or 700 (e.g., the BPFs 230 and 235) and the baseband digital processing circuits 285 and 290 perform the method 500. First, gain in the filter 400 is set (510) to a default setting (e.g., 0 by setting $R_f$ and $R_i$ to be equal to each other). Next, the signal is amplified (520) according to the setting. The signal to noise ratio is then measured (530). If (540) it is determined that the gain is sufficient because the signal to noise ratio is sufficient, the method 500 then ends. Otherwise, the gain setting is adjusted (550) upwards and the amplifying (520), measuring (530), and determining (540) are repeated until the signal to noise ratio is adequate.

In an embodiment of the invention, the measuring (530) can determine if the gain is appropriate (too high or too low) and the adjusting (550) can adjust the gain up or down accordingly.

Figure 6:
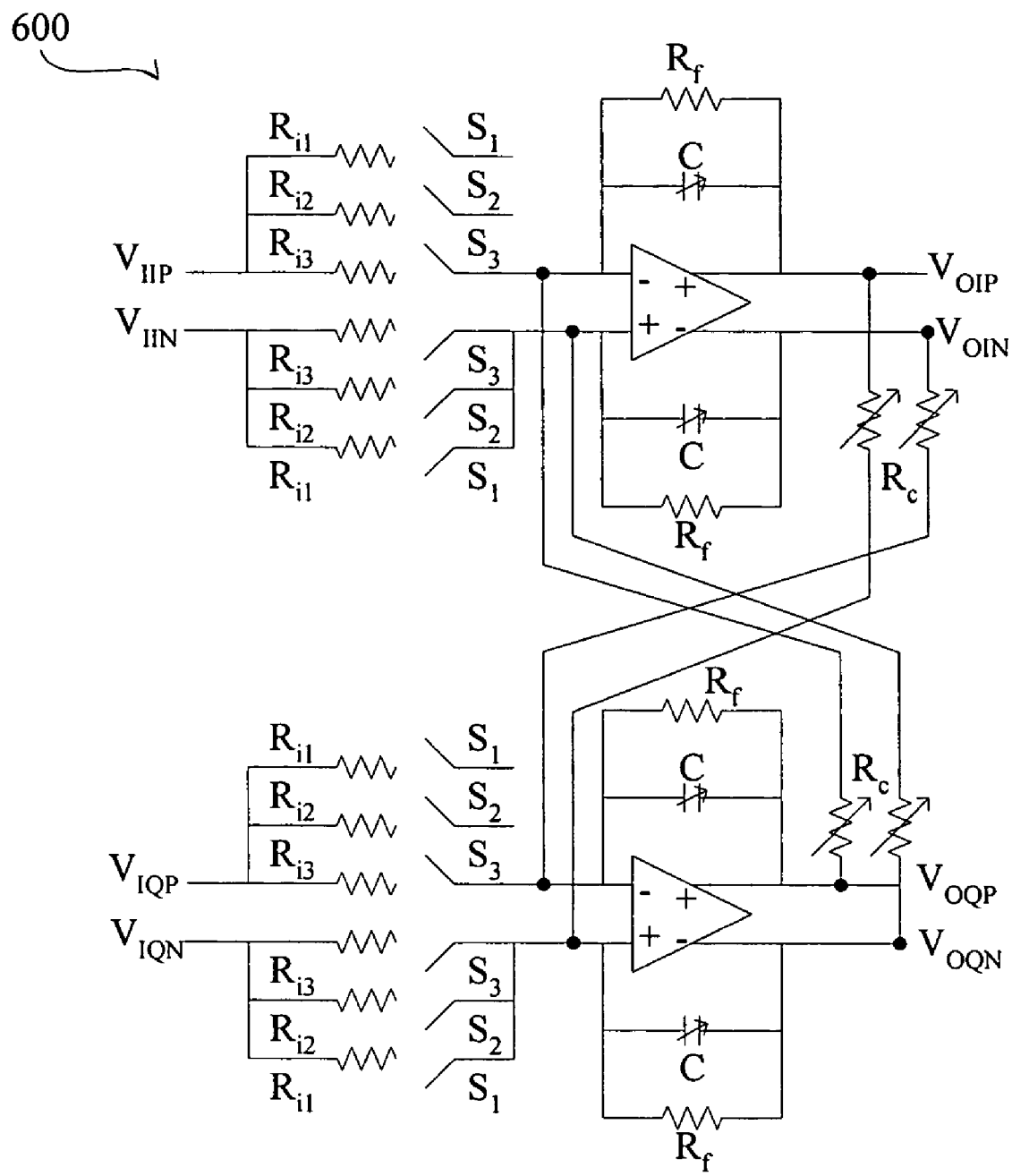
FIG. 6 is a diagram illustrating a bandpass filter of the receiver IF section of FIG. 2 according to an embodiment of the invention.

FIG. 6 is a diagram illustrating a BPF 600 of the receiver IF section of FIG. 2 according to an embodiment of the invention. The BPF 600 is substantially similar to the BPF 400 except that the resistor array structure of $R_i$ is shown in more detail. The BPF 600 (e.g., the bandpass filters 230 and 235) includes two variable resistors $R_i$. Each of the variable resistors Ri can comprise 3 resistors, $R_{i1}$, $R_{i2}$, and $R_{i3}$, in parallel with a switch, $S_1$, $S_2$, and $S_3$, for each resistor, respectively. Gain for the BPF 600 is equal to $R_f/R_i$. $R_{i1}$, $R_{i2}$, and $R_{i3}$ can each have equal or different resistances. Three gain settings are achieved. With $S_1$ on and $S_2$, $S_3$ off Gain will be $R_f/R_{i1}$. With $S_2$ on and $S_1$, $S_3$ off Gain will be $R_f/R_{i2}$. With $S_3$ on and $S_1$, $S_3$ off Gain will be $R_f/R_{i3}$. However, each switch itself provides a small resistance, which must be added to the resistance of each resistor, thereby decreasing gain to less than what was designed. $R_f$ can also be variable and share a similar array structure as $R_i$.

Figure 7:
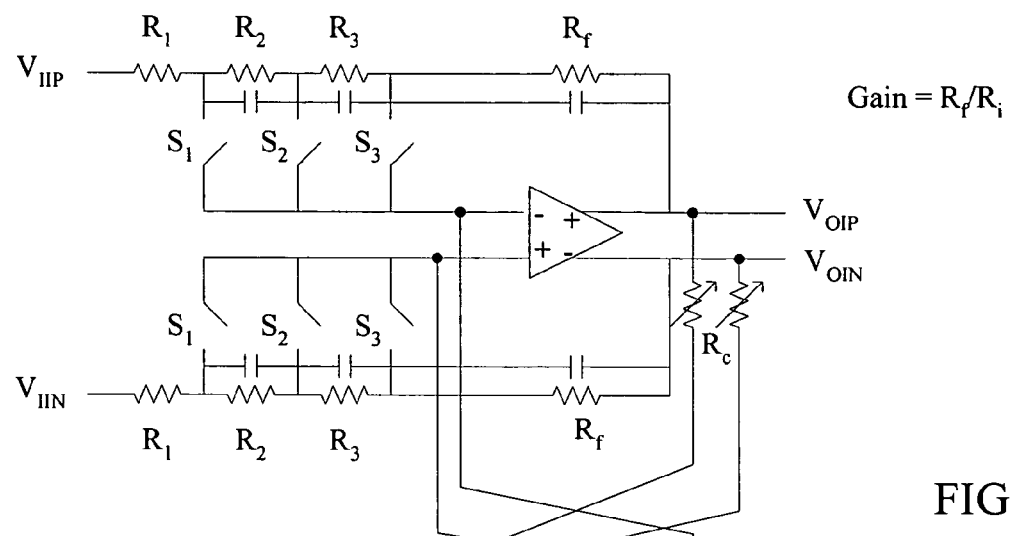
FIG. 7 is a diagram illustrating a bandpass filter of the receiver IF section of FIG. 2 according to an embodiment of the invention.
Figure 7:
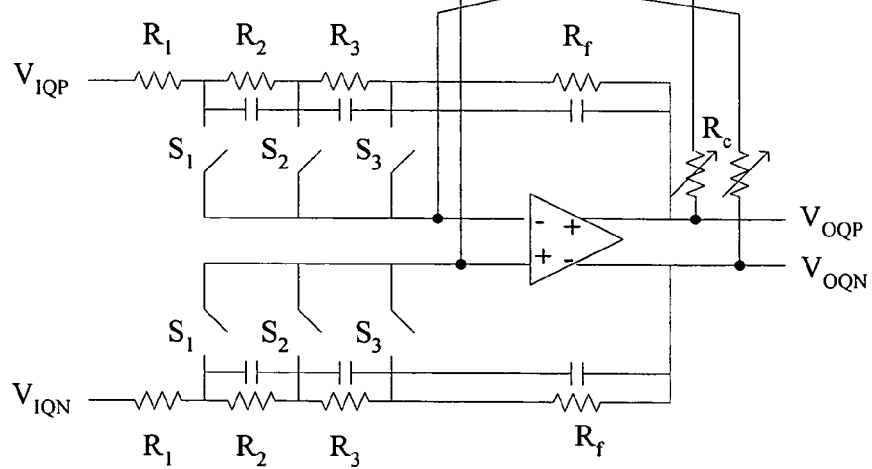

FIG. 7 is a diagram illustrating a BPF 700 (e.g., the bandpass filters 230 and 235) of the receiver IF section of FIG. 2 according to an embodiment of the invention. The BPF 700 is substantially similar to the BPF 400 except for the resistor array structure of $R_i$. Gain is equal to $R_f/R_i$, wherein $R_i$ comprises a plurality of resistors $R_1$, $R_2$, and $R_3$ coupled in series. Each of the resistors can have equal or different resistances. Capacitors run in parallel with the resistors $R_2$ and $R_3$ as well as $R_f$. Switches are located perpendicular to the resistors (e.g., out of the path of the resistors). Specifically, $S_1$ is perpendicularly coupled between $R_1$ and $R_2$; $S_2$ is perpendicularly coupled between $R_2$ and $R_3$; and $S_3$ is perpendicularly coupled between $R_2$ and $R_f$. As such, the switches are outside of the path of the current flow and therefore do not add their own resistance to $R_i$, thereby increasing the accuracy of gain settings. Specifically, with $S_1$ on and $S_2$, $S_3$ off, the gain will be $(R_f + R_3 + R_2)/(R_1)$. With $S_2$ on and $S_1$, $S_3$ off, the gain will be $(R_f + R_3)/(R_1 + R_2)$. With $S_3$ on and $S_1$, $S_3$ off, the gain will be $(R_f)/(R_1+R_2+R_3)$. In other words, gain settings are independent of any switch resistance. In an embodiment of the invention, $R_f$ can have structure similar to $R_i$.

The gain settings of the BPF in this embodiment are 20 dB, 10 dB and 0 dB which are equivalent gains of 10, 3.16 and 1, respectively. Therefore $R_f$, $R_1$, $R_2$, $R_3$ are chosen such that:

20 dB=20 log (10)=$S_1$ on, $S_2$ off, $S_3$ off=$(R_f+R_3+R_2)/(R_1)$
10 dB=20 log (3.16)=$S_1$ off, $S_2$ on, $S_3$ off=$(R_f+R_3)/(R_1+R_2)$
0 dB=20 log (1)=$S_1$ off, $S_2$ off, $S_3$ on=$(R_f)/(R_1+R_2+R_3)$ The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
   filtering a signal with a bandpass filter;
   measuring the signal to noise ratio of the filtered signal; and
   adjusting the bandpass filter to increase the gain if the signal to noise ratio is insufficient by varying resistance of an input resistor array of the filter, the array having a plurality of resistors in series with switches that are out of the path of the current when the resistors are in use.

2. The method of claim 1, further comprising:
   measuring image rejection and DC offset rejection of the filtered signal; and
   adjusting a center frequency of the bandpass filter.

3. The method of claim 1, wherein the bandpass filter comprises two cross-coupled low pass filters.

4. The method of claim 3, wherein the cross-coupling includes cross-coupled variable resistors.

5. The method of claim 4, wherein adjusting the resistance of the cross-coupled resistors varies the center frequency of the bandpass filter.

6. The method of claim 1, wherein the switches are located perpendicular to and between the resistors.

7. The method of claim 1, wherein the bandpass filter gain is adjustable between 0 and 30 db in 10 db steps.

8. A system, comprising:
   means for filtering a signal with a bandpass filter;
   means for measuring sufficiency of the signal to noise ratio of the filtered signal; and
   means for adjusting the bandpass filter to increase the gain if the signal to noise ratio is insufficient by varying resistance of an input resistor array of the filter, the array having a plurality of resistors in series with switches that are out of the path of the current when the resistors are in use.

9. A system, comprising:
   a bandpass filter capable of filtering a received signal and capable of amplifying an amplitude of the received signal by varying resistance of an input resistor array of the filter, the array having a plurality of resistors in series with switches that are out of the path of the current when the resistors are in use; and
   at least one baseband circuit, communicatively coupled to the bandpass filter, capable of measuring sufficiency of the signal to noise ratio of a signal output from the bandpass filter.

10. The system of claim 9, wherein the bandpass filter can vary the amplification of the received signal based on feedback from the baseband circuit.

11. The system of claim 9, further comprising at least one measurement, communicatively coupled to the filter, capable of measuring image rejection and DC offset rejection, and wherein the bandpass filter is capable of adjusting a center frequency of the filter based on the measuring.

12. The system of claim 9, wherein the bandpass filter comprises two cross-coupled low pass filters.

13. The system of claim 12, wherein the cross-coupling includes cross-coupled variable resistors.

14. The system of claim 13, wherein adjusting the resistance of the cross-coupled resistors varies the center frequency of the bandpass filter.

15. The system of claim 9, wherein the switches are located perpendicular to and between the resistors.

16. The system of claim 9, wherein the bandpass filter gain is adjustable between 0 and 30 db in 10 db steps.

17. A receiver incorporating the system of claim 9.

* * * * *